United States Patent
Coteus et al.

(10) Patent No.: US 8,289,798 B2
(45) Date of Patent: Oct. 16, 2012

(54) VOLTAGE REGULATOR BYPASS IN MEMORY DEVICE

(75) Inventors: Paul W. Coteus, Yorktown, NY (US); Kevin C. Gower, Lagrangeville, NY (US); Kyu-Hyoun Kim, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 265 days.

(21) Appl. No.: 12/725,822

(22) Filed: Mar. 17, 2010

(65) Prior Publication Data

US 2011/0228622 A1   Sep. 22, 2011

(51) Int. Cl.
*G11C 5/14* (2006.01)
*G06F 1/26* (2006.01)

(52) U.S. Cl. ......... 365/226; 365/227; 713/320; 713/340

(58) Field of Classification Search .................... 365/226
See application file for complete search history.

(56) References Cited

U.S. PATENT DOCUMENTS

| | | | | |
|---|---|---|---|---|
| 5,280,455 A | * | 1/1994 | Kanaishi | 365/229 |
| 5,373,477 A | * | 12/1994 | Sugibayashi | 365/226 |
| 5,530,398 A | * | 6/1996 | Shamlou et al. | 327/545 |
| 5,612,920 A | * | 3/1997 | Tomishima | 365/226 |
| 5,644,250 A | * | 7/1997 | Ooishi | 326/16 |
| 5,956,278 A | * | 9/1999 | Itou | 365/201 |
| 6,005,819 A | * | 12/1999 | Shin | 365/226 |
| 6,661,279 B2 | * | 12/2003 | Yabe | 327/546 |
| 6,930,948 B2 | * | 8/2005 | Lee et al. | 365/226 |
| 7,212,067 B2 | * | 5/2007 | Pasternak | 327/541 |
| 7,453,741 B2 | * | 11/2008 | Kim et al. | 365/189.09 |
| 7,765,418 B2 | * | 7/2010 | Mann et al. | 713/320 |
| 2011/0128070 A1 | * | 6/2011 | Pagano et al. | 327/536 |

OTHER PUBLICATIONS

H. Banba et al., "A CMOS Bandgap Reference Circuit With Sub-1-V Operation", IEEE Journal of Solid-State Circuits, Vol. 34, No. 5, May 1999, pp. 670-674.

* cited by examiner

*Primary Examiner* — Son Mai
(74) *Attorney, Agent, or Firm* — James Boice

(57) ABSTRACT

A memory chip comprises an internal voltage regulator that is selectively enabled/disabled to regulate an external voltage used by the memory chip subunit.

18 Claims, 9 Drawing Sheets

VOLTAGE REGULATOR BYPASS IN MEMORY DEVICE

BACKGROUND

The present disclosure relates to the field of computers, and specifically to memory devices used by computers. Still more particularly, the present disclosure relates to managing internal voltages in memory devices used by computers.

BRIEF SUMMARY

A memory chip subunit, which in one embodiment is a component of a memory chip within a memory module within a computer system, comprises an internal voltage regulator that is selectively enabled/disabled to regulate an external voltage used by the memory chip subunit.

In one embodiment, a method of regulating an internal voltage in a memory comprises initially powering up a memory module by using an external voltage from an external voltage source. In response to determining whether the external voltage substantially matches a requisite internal voltage needed by a memory chip subunit, an internal voltage regulator used by the memory chip subunit is selectively enabled/disabled, thereby causing the external voltage to be selectively regulated for use by the memory chip subunit.

DETAILED DESCRIPTION

Figure 1:
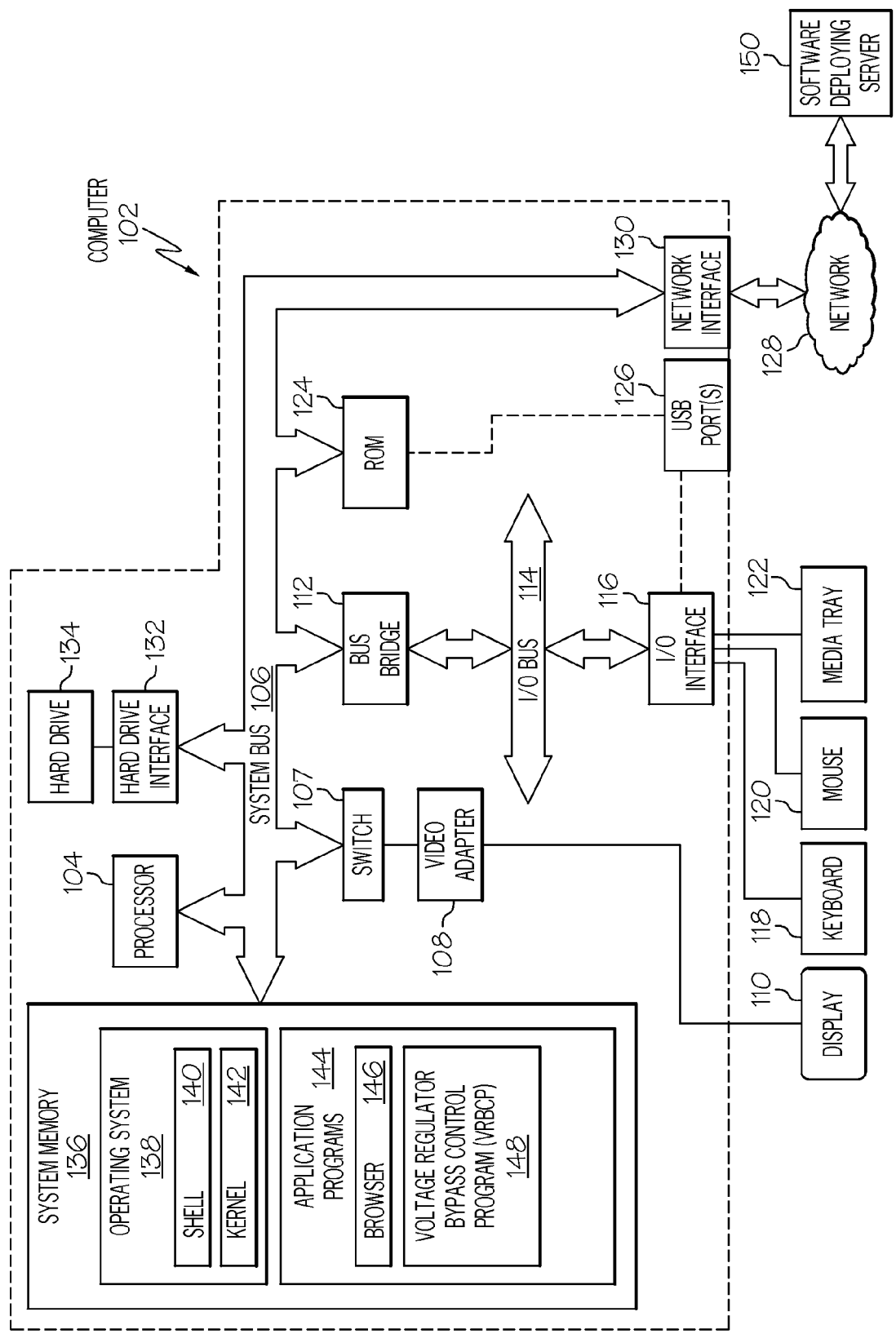
FIG. 1 depicts an exemplary computer in which the present disclosure may be implemented.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including, but not limited to, wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

With reference now to the figures, and in particular to FIG. 1, there is depicted a block diagram of an exemplary computer 102, which may utilize the present invention. Note that some or all of the exemplary architecture, including both depicted hardware and software, shown for and within computer 102 may be utilized by software deploying server 150.

Computer 102 includes a processor 104 that is coupled to a system bus 106. Processor 104 may utilize one or more processors, each of which has one or more processor cores. A video adapter 108, which drives/supports a display 110, is also coupled to system bus 106. In one embodiment, a switch 107 couples the video adapter 108 to the system bus 106. Alternatively, the switch 107 may couple the video adapter 108 to the display 110. In either embodiment, the switch 107 is a switch, preferably mechanical, that allows the display 110 to be coupled to the system bus 106, and thus to be functional only upon execution of instructions (e.g., voltage regulator bypass control program—VRBCP 148 described below) that support the processes described herein.

System bus 106 is coupled via a bus bridge 112 to an input/output (I/O) bus 114. An I/O interface 116 is coupled to I/O bus 114. I/O interface 116 affords communication with various I/O devices, including a keyboard 118, a mouse 120, and a media tray 122 (which may include storage devices such as CD-ROM drives, multi-media interfaces, etc.). While the format of the ports connected to I/O interface 116 may be any known to those skilled in the art of computer architecture, in a preferred embodiment some or all of these ports are universal serial bus (USB) ports, particularly when USB ports 126 are provided for additional I/O functionality. Also coupled to system bus 106 is a read only memory (ROM) 124, which is a static (and optionally programmable—PROM and/or erasable—EPROM) memory used to store boot programs and other static information.

As depicted, computer 102 is able to communicate with a software deploying server 150 via network 128 using a network interface 130. Network 128 may be an external network such as the Internet, or an internal network such as an Ethernet or a virtual private network (VPN).

A hard drive interface 132 is also coupled to system bus 106. Hard drive interface 132 interfaces with a hard drive 134. In a preferred embodiment, hard drive 134 populates a system memory 136, which is also coupled to system bus 106. System memory is defined as a lowest level of volatile memory in computer 102. This volatile memory includes additional higher levels of volatile memory (not shown), including, but not limited to, cache memory, registers and buffers. Data that populates system memory 136 includes computer 102's operating system (OS) 138 and application programs 144.

OS 138 includes a shell 140, for providing transparent user access to resources such as application programs 144. Generally, shell 140 is a program that provides an interpreter and an interface between the user and the operating system. More specifically, shell 140 executes commands that are entered into a command line user interface or from a file. Thus, shell 140, also called a command processor, is generally the highest level of the operating system software hierarchy and serves as a command interpreter. The shell provides a system prompt, interprets commands entered by keyboard, mouse, or other user input media, and sends the interpreted command(s) to the appropriate lower levels of the operating system (e.g., a kernel 142) for processing. Note that while shell 140 is a text-based, line-oriented user interface, the present invention will equally well support other user interface modes, such as graphical, voice, gestural, etc.

As depicted, OS 138 also includes kernel 142, which includes lower levels of functionality for OS 138, including providing essential services required by other parts of OS 138 and application programs 144, including memory management, process and task management, disk management, and mouse and keyboard management.

Application programs 144 include a renderer, shown in exemplary manner as a browser 146. Browser 146 includes program modules and instructions enabling a world wide web (WWW) client (i.e., computer 102) to send and receive network messages to the Internet using hypertext transfer protocol (HTTP) messaging, thus enabling communication with software deploying server 150 and other computer systems.

Application programs 144 in computer 102's system memory (as well as software deploying server 150's system memory) also include a voltage regulator bypass control program (VRBCP) 148. VRBCP 148 includes code for implementing the processes described below, including those described in FIGS. 3-10. In one embodiment, computer 102 is able to download VRBCP 148 from software deploying server 150, including in an on-demand basis, wherein the code in VRBCP 148 is not downloaded until needed for execution to define and/or implement the improved enterprise architecture described herein. Note further that, in one embodiment of the present invention, software deploying server 150 performs all of the functions associated with the present invention (including execution of VRBCP 148), thus freeing computer 102 from having to use its own internal computing resources to execute VRBCP 148.

The hardware elements depicted in computer 102 are not intended to be exhaustive, but rather are representative to highlight essential components required by the present invention. For instance, computer 102 may include alternate memory storage devices such as magnetic cassettes, digital versatile disks (DVDs), Bernoulli cartridges, and the like. These and other variations are intended to be within the spirit and scope of the present invention.

Figure 2:
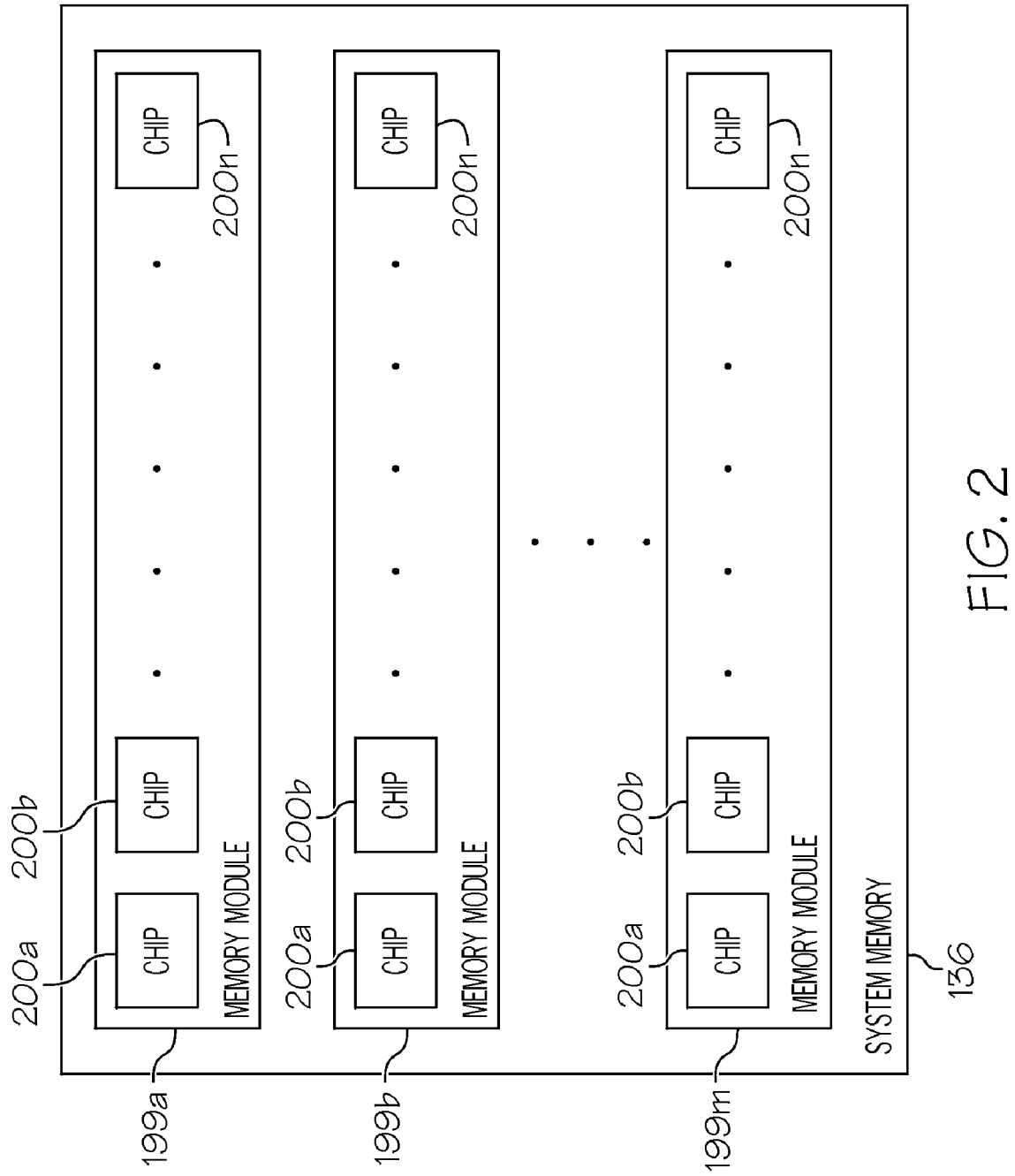
FIG. 2 presents additional detail of system memory 136 shown in FIG. 1.

Referring now to FIG. 2, an exemplary system memory 136 embodying novel features disclosed herein is presented. System memory 136 comprises multiple memory modules 199a-m (wherein "m" is an integer). Exemplary memory modules include, but are not limited to, dual inline memory modules (DIMMs), single inline memory modules (SIMMSs), etc. Within each of the memory modules 199a-m are multiple memory chips 200a-n (where "n" is an integer). Additional detail regarding memory chips 200a-n is presented below. Note that the configuration of memory modules shown in FIG. 2 for system memory 136 can also be used for ROM 124 shown in FIG. 1, as well as any other memory system within or coupled to a computer such as computer 102.

Figure 3:
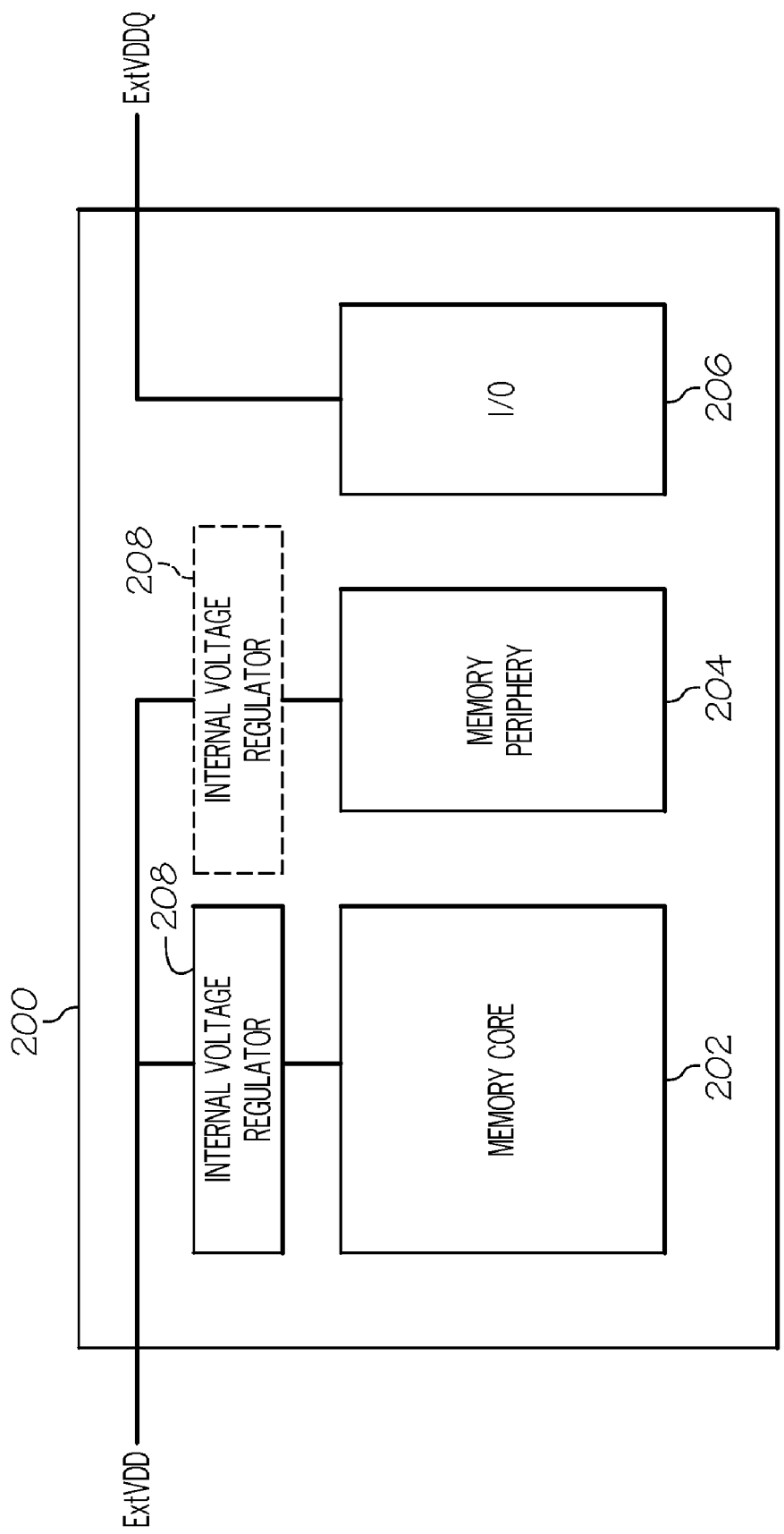
FIG. 3 illustrates an exemplary memory chip used in the present disclosure.

Referring now to FIG. 3, an exemplary memory chip 200 (e.g., a component of system memory 136 and/or ROM 124 depicted in FIG. 1) in which the presently disclosed system and process can be implemented is presented. Memory chip 200 is depicted as having several memory chip subunits, including a memory core 202 and a memory periphery 204. The memory core 202 contains data that is stored in memory cells of a cell array. The cell array may utilize dynamic random access memory (DRAM) storage cells, read only memory (ROM) storage cells, etc. Memory core 202 also includes amplifiers, row decoders, cell decoders and other primary support logic for powering the memory core 202, and for accessing data within the cell array located within memory core 202. Memory periphery 204 provides secondary support to the memory core 202 through the provision of a state machine (e.g., logic for keeping track of a modified-shared-exclusive-invalid (MESI) state of data stored in the memory core 202), timing circuits, command decoders and other higher-level features used to manage and access stored data in the memory core 202. The memory chip subunits (i.e., memory core 202 and memory periphery 204) are coupled to an external voltage source (not shown) that provides voltage ExtVDD to the memory core 202 and the memory periphery 204. Similarly, an external voltage source (also not shown, and which may be the same or different as the external voltage source that provides voltage ExtVDD) provides voltage ExtVDDQ to power input/output (I/O) 206, which includes drivers, clocks, phase locked loops, etc. required to interface with memory chip 200.

Figure 4:
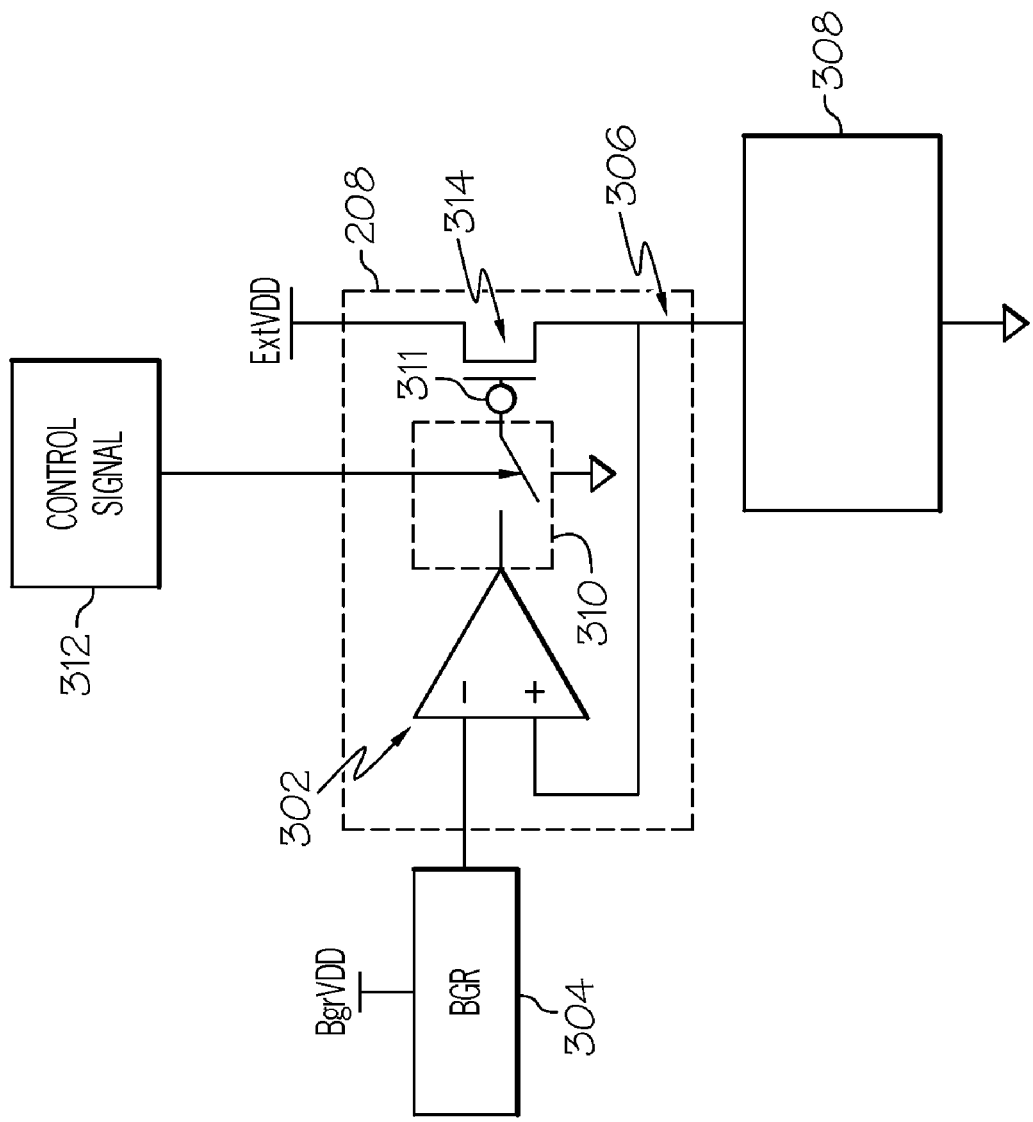
FIG. 4 depicts a functional schematic of an exemplary internal voltage regulator used by the memory chip shown in FIG. 3.

As depicted, chip subunits memory core 202 and/or memory periphery 204 are coupled to the external voltage source providing ExtVDD via an internal voltage regulator 208. Additional detail of internal voltage regulator 208 is shown in a functional schematic shown in FIG. 4. As depicted in FIG. 4, internal voltage regulator 208 includes a differential amplifier 302, which in one embodiment is an operational amplifier (Op Amp). One input to differential amplifier 302 is the voltage from a reference voltage source 304, such as a bandgap voltage reference (BGR) having a known/guaranteed voltage output (e.g., 1.25 VDC). The other input to differential amplifier 302 is the voltage from a voltage input 306 to a memory chip subunit 308 (e.g., memory core 202 and/or memory periphery 204 depicted in FIG. 3 and described above). Note that the reference voltage source 304 provides a voltage that describes (i.e., substantially matches) the requisite internal voltage needed by the memory chip subunit 308 to operate within predefined parameters (e.g., at a predetermined access speed, precision, bandwidth, etc.)

As depicted in FIG. 4, internal voltage regulator 208 comprises a bypass switch 310. As depicted in an exemplary embodiment, bypass switch 310 is a single pole, double throw switch controlled by a control signal 312. When control signal 312 is at a first logic level, an output of differential amplifier 302 is passed to a control input 311 of voltage switch 314, depicted in FIG. 4 as a p-channel field effect transistor (PFET). When control signal 312 is at a second logic level, ground is passed to the control input 311 of voltage switch 314.

If internal voltage regulator 208 is operational/enabled (i.e., if bypass switch 310 is in the first logic level in accordance with an external control signal such as control signal 312, thus coupling differential amplifier 302 to control input 311 of voltage switch 314), then the external voltage (ExtVDD) is regulated before being input into memory chip subunit 308 in order to adjust ExtVDD to match the reference voltage provided by the reference voltage source 304. Thus, if ExtVDD supplied by an external voltage source (not shown) fails to substantially match the requisite internal voltage needed by memory chip subunit 308, then the internal voltage regulator 208 is enabled (i.e., bypass switch 310 passes the output from differential amplifier 302 to voltage switch 314). This causes ExtVDD to be regulated such that the voltage at the voltage input 306 for memory chip subunit 308 matches the reference voltage from the reference voltage source 304.

However, if the bypass switch 310 is controlled by the control signal 312, such that the differential amplifier 302 is decoupled from the voltage switch 314, the control input 311 goes to ground (as depicted), and the internal voltage regulator 208 is disabled, then the voltage switch 314 is fully turned on and passes ExtVDD with minimal voltage drop. In the embodiment shown, wherein voltage switch 314 is a PFET, the PFET is large enough to pass required current to memory chip subunit 308 with minimal voltage drop across the PFET. This results in ExtVDD being unregulated and directly input into the voltage input 306 for the memory chip subunit 308. Voltage switch 314 is highly conductive (and the internal voltage regulator 208 is disabled) whenever ExtVDD is known to match the requisite internal voltage (e.g., 1.25 VDC) needed by the memory chip subunit 308 for optimal (or at least nominal) performance. The ExtVDD is known to match the requisite internal voltage in various scenarios, including, but not limited to, the following. For example, if the ExtVDD has been measured and confirmed to match the requisite internal voltage, then bypass switch 310 couples control input 311 to ground as depicted and internal voltage regulator 208 is disabled. If the memory module is coupled to a socket that is dedicated to memory requiring a requisite certain voltage (e.g., 1.25 VDC), and thus the socket has connectors to a dedicated memory power subsystem that provides that requisite certain voltage, then bypass switch 310 couples ground to control input 311 and internal voltage regulator 208 is disabled. In one embodiment, the control signal 312 is a mode register set (MRS) bit that is set in accordance with conditions such as those described herein being met. That is, the MRS bit is set by various exemplary situations that cause control signal 312 to disable the internal voltage regulator 208 (if ExtVDD matches the requisite internal voltage needed by memory chip subunit 308) or to enable the internal voltage regulator 208 (if ExtVDD fails to match the requisite internal voltage needed by memory chip subunit 308).

Furthermore, the control signal 312 (using MRS or not) can be controlled by a predefined power-up sequence of the memory module and/or a memory chip on which the memory module resides. Thus, if the predefined power-up sequence of the memory chip subunit (and/or memory chip) has been preprogrammed to either disable or enable the internal voltage regulator 208 at start-up, then the bypass switch is initially controlled according to a control signal 312 generated by the start-up sequence (e.g., instructions from a boot-up ROM, etc.).

Note that reference voltage source 304 is depicted in exemplary manner as a bandgap voltage reference (BGR) chip, having a supply voltage of BgrVDD. If BgrVDD is greater than ExtVDD (e.g., if BgrVDD is 1.6 VDC), the reference voltage source 304 will be capable of providing a reference output of 1.25 VDC based on the required headroom of the BGR unit. However, if BgrVDD is the same as ExtVDD, then a voltage divider from voltage input 306 is used to match the plus input to differential amplifier 302 with the minus input from the BGR. For example, assume that BgrVDD equals ExtVDD, which equals 1.25 VDC. If the BGR (reference voltage source 304) uses 20% of BgrVDD to generate an output voltage, then the output of the BGR will be 0.80× 1.25=1.00 VDC. Thus, a voltage divider (not shown, but using a simple resistor circuit to drop the voltage from voltage input 306) will also drop the voltage at voltage input 306 by 20%. This linear voltage drop (20% in both the BGR/reference voltage source 304 output and the voltage coming from the voltage input 306) allows the internal voltage regulator 208 to operate as described above.

Figure 5:
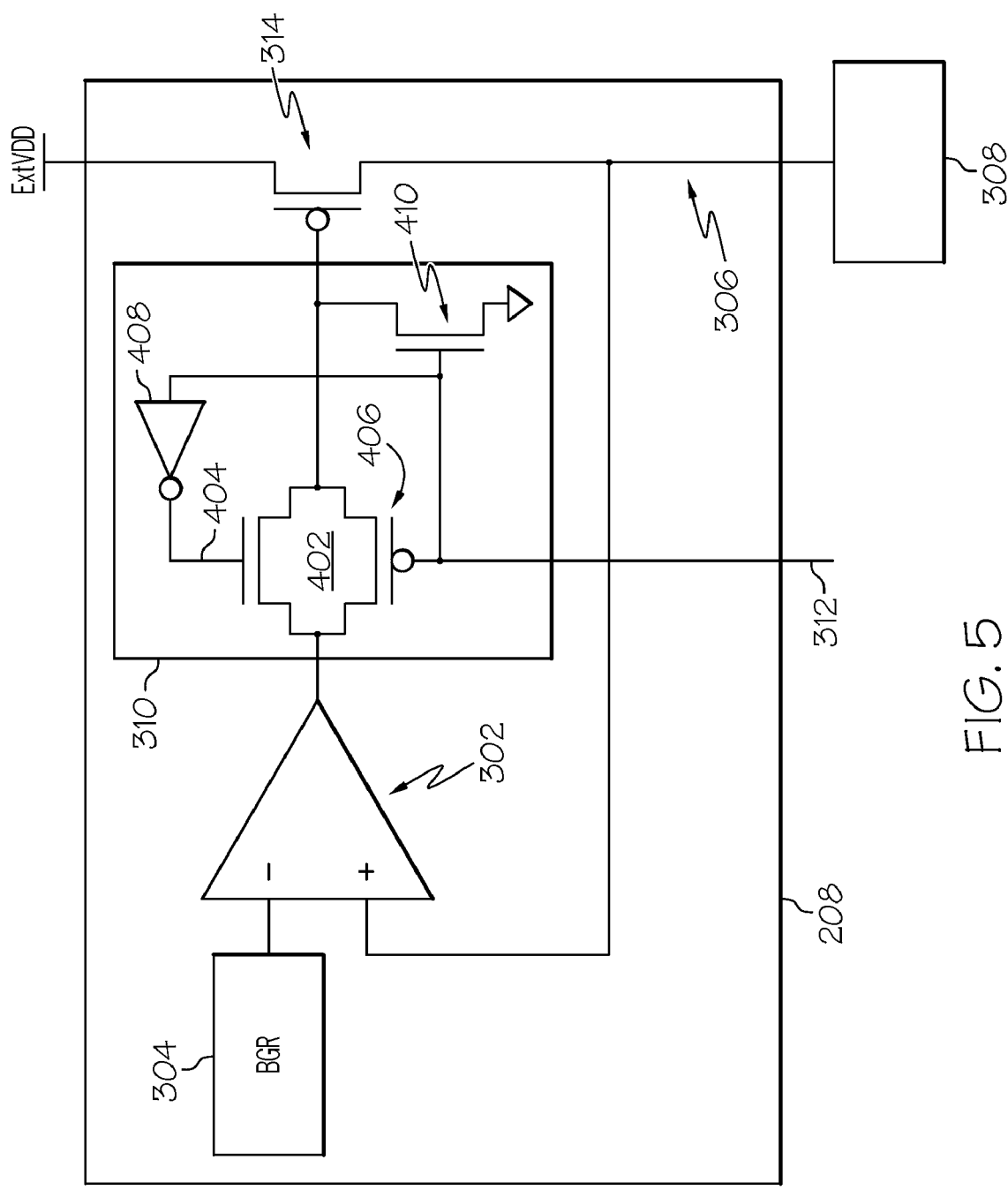
FIG. 5 illustrates a circuit schematic of an exemplary circuitry used in the internal voltage regulator shown in FIG. 4.

With reference now to FIG. 5, an exemplary circuitry schematic of internal voltage regulator 208 is presented. More specifically, bypass switch 310 is shown to comprise a passgate 402, made up of a pair of transistors (e.g., NFET 404 and PFET 406). NFET 404 is controlled by an output from an inverter 408, which uses control signal 312 as an input. Similarly, an NFET 410, which is tied to the voltage switch 314, and PFET 406 also are controlled by control signal 312, in order to provide the switching functionality shown and described above in FIG. 4. In one embodiment, power to the BGR/reference voltage source 304 and the differential amplifier 302 is cut whenever the control signal 312 indicates that the ExtVDD is the correct voltage needed at voltage input 306. Power to differential amplifier 302 and BGR/reference voltage source 304 can be cut since passgate 402 will be turned off in this situation, and thus has no need for an input. If the control signal later indicates that ExtVDD needs to be regulated, then power to differential 302 and BGR/reference voltage source 304 is once again restored.

Figure 6:
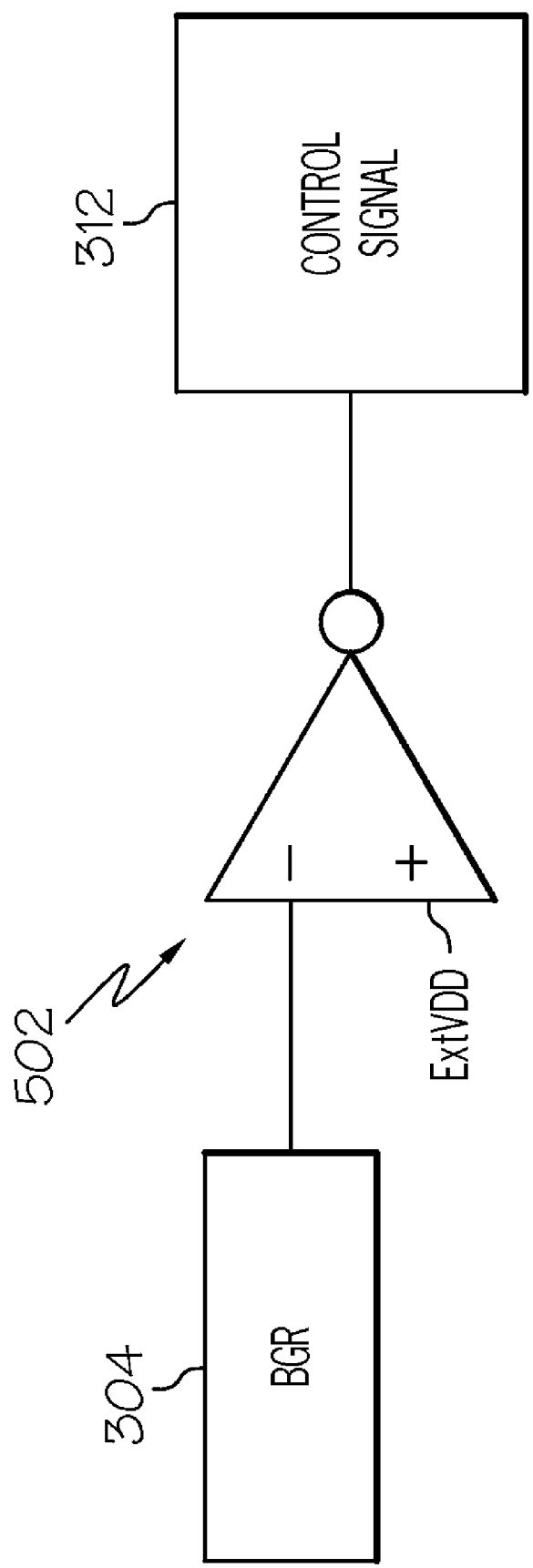
FIG. 6 depicts a schematic of a differential amplifier generating a control signal that, in one embodiment, controls the internal voltage regulators shown in FIGS. 3-5.

With reference now to FIG. 6, one embodiment for generating control signal 312 uses an inverted differential amplifier 502 that compares the output of BGR/reference voltage source 304 with ExtVDD. If they are the same, then the inverted output (control signal 312) is high, thus causing the ExtVDD to be supplied directly to the memory chip subunit 308. Conversely, if output of BGR/reference voltage source 304 is lower than the voltage of ExtVDD, then the inverted output (control signal 312) is low, thus causing the bypass switch 310 shown above to pass the output from differential amplifier 302 to control input 311, resulting in ExtVDD being regulated before being supplied to the memory chip subunit 308. In one embodiment, the circuitry shown in FIG. 6 is contained within memory chip (e.g., memory chip 200 depicted in FIG. 3) and/or a memory module 199 (shown above in FIG. 2) in system memory 136 or ROM 124.

Figure 8:
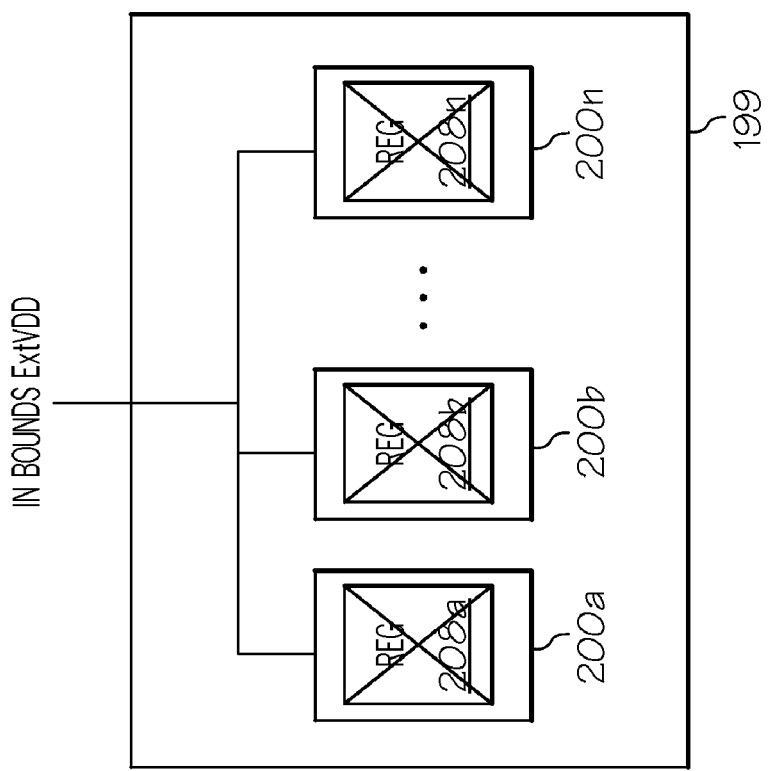
FIG. 8 illustrates a memory module in which the internal voltage regulators in memory chips are disabled.
Figure 7:
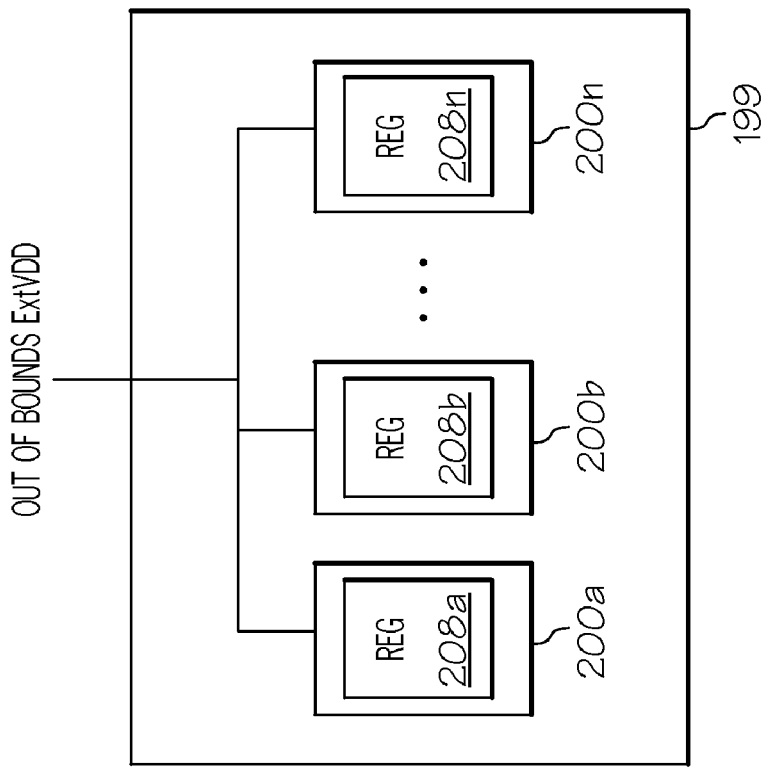
FIG. 7 illustrates a memory module in which the internal voltage regulators in memory chips are enabled.
Figure 9:
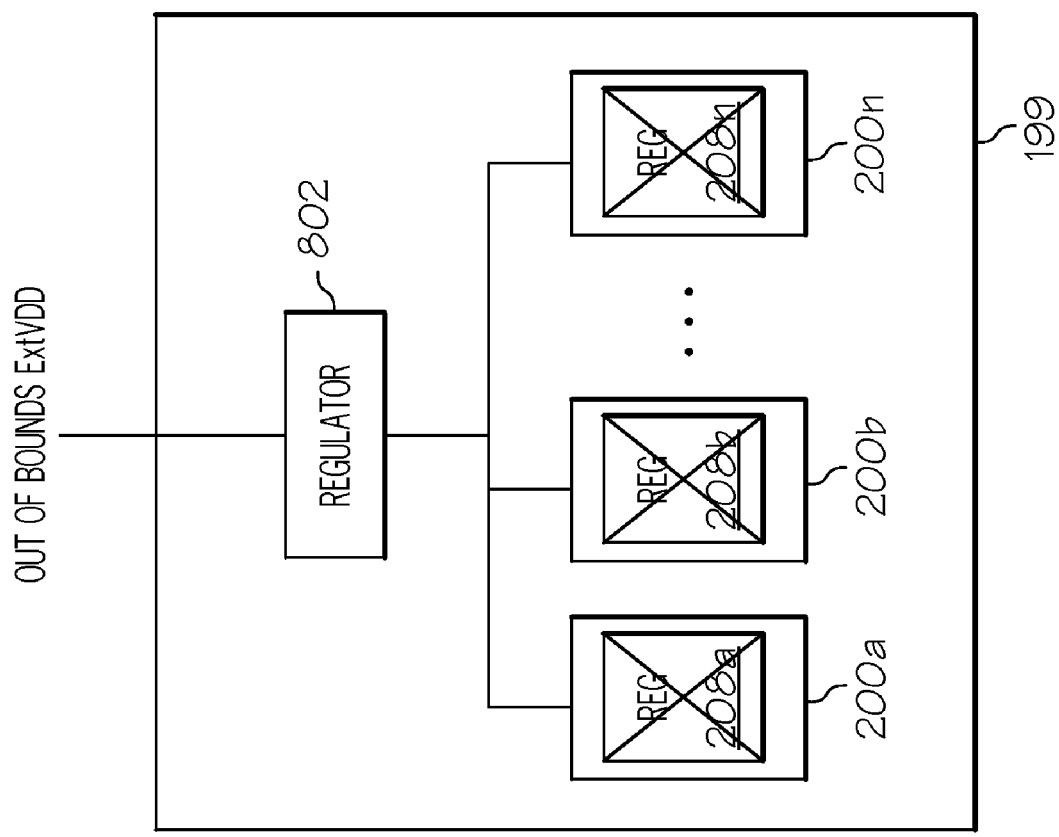
FIG. 9 illustrates a memory module having a central internal voltage regulator used to regulate voltages for all memory chips within the memory module.

While memory chip 200 has been depicted as a stand-alone device in FIG. 3 above, note that memory modules 200a-n can be part of a memory module 199 such as that used by system memory 136 and/or ROM 124 shown in FIG. 1 above. Thus, as depicted in FIGS. 7-9, multiple memory chips 200a-n (where "n" is an integer) make up the memory module 199 (e.g., system memory 136 and/or ROM 124 depicted in FIG. 1). As depicted in FIG. 7, if the external ExtVDD supplied to the multiple memory chips 200a-n is "out of bounds" (i.e., fails to substantially match the voltage needed for optimal, or at least nominal, operation of a memory module), then the internal voltage regulators 208a-n (multiple units of the internal voltage regulator 208 shown in FIGS. 3-5) are enabled as described above. Note that each of the internal voltage regulators 208a-n can be selectively and individually enabled/disabled in the manner described above. As depicted in FIG. 8, however, if the external ExtVDD is "in bounds" (i.e., substantially matches the voltage needed for optimal, or at least nominal, operation of a memory module), then one or more of the internal voltage regulators 208a-n are selectively disabled.

Similarly, as depicted in FIG. 9, if the memory module 199 has an internal voltage regulator 802 to regulate out of bounds ExtVDD for one or more of the multiple memory chips 200a-n, then one or more of the internal voltage regulators 208a-n located within each of the multiple memory chips 200a-n are disabled.

Note that while the memory module 199 may be any memory unit that comprises multiple memory chips, in one embodiment these memory modules are dual inline memory modules (DIMMs).

Figure 10:
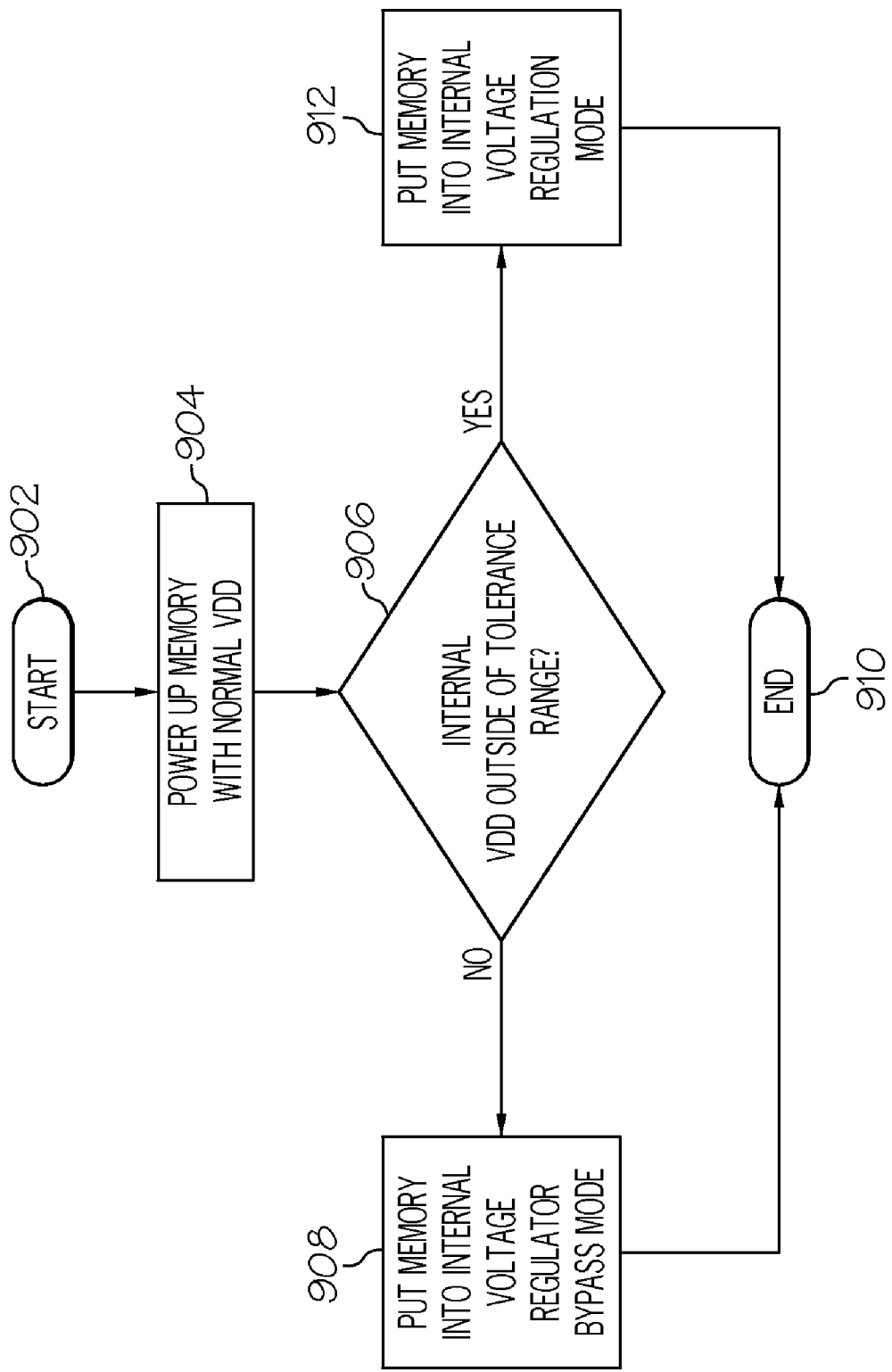
FIG. 10 is a high level flow chart of one or more exemplary steps taken by a processor to control the enablement/disablement of internal voltage regulators.

With reference now to FIG. 10, a high-level flow chart of exemplary steps taken to selectively enable/disable an internal voltage regulator for a memory module is presented. After initiator block 902, a memory chip (and/or memory module containing multiple memory chips) is powered up using an external voltage source (e.g., to provide ExtVDD described above), as described in block 904. If the external voltage provided by the external voltage source substantially matches the requisite internal voltage needed by one or more memory chip subunits within the memory chip/module (query block 906), then the internal voltage regulator is bypassed (block 908), allowing the external voltage to be directly supplied to the memory chip subunits. That is, if the internal VDD is the same as the external ExtVDD being provided to the memory chip subunit, and that internal VDD is not outside of the tolerance range of voltages needed for optimal, or at least nominal, operation of the memory chip subunit, then the internal voltage regulator for that memory chip subunit (and/or the entire memory chip (e.g., one or more of the memory chips 200a-n shown in FIG. 2) and/or the entire memory module (e.g., memory module 199a shown in FIG. 2)) is bypassed (block 908), and the process ends at terminator block 910. If, however, the external voltage is not proper for optimal (or nominal) operation of the memory chip subunit(s) (query block 906), then the internal voltage regulator is enabled (block 912), resulting in the input voltage to the memory chip subunits, memory chip, and/or memory module being regulated.

In one embodiment, the optimal and/or nominal operation of the memory chip subunit(s) are predefined parameters. These predefined parameters may be set by a user, software monitoring logic that monitors system requirements and conditions of memory (e.g., dynamically monitoring what access speed is needed by a computer hardware or software component, where the memory is plugged in (in what socket), etc.). Similarly, determining whether the external voltage substantially matches the requisite internal voltage can be in accordance with a pre-defined range of acceptable voltages for use by the memory chip subunit. Thus, voltages within the range of 1.15 VDC and 1.30 VDC may be deemed acceptable, while those outside of this range are deemed unacceptable. In this example a voltage from the ExtVDD of 1.20 VDC would substantially match a requisite internal voltage of 1.25 VDC, while a voltage from the ExtVDD of 1.40 VDC would not substantially match the requisite internal voltage of 1.25 VDC.

Note further that, as described above in one embodiment, determining whether the external voltage matches the requisite interval voltage is made by taking a direct measurement of the external voltage (e.g., the external voltage source has been set to the requisite internal voltage needed by the memory chip subunit, by using circuitry such as that shown above in FIG. 6), by detecting that the memory module has been coupled to a dedicated memory power subsystem within the computer, by detecting an external voltage regulator that has been set to regulate an external voltage supply to the requisite internal voltage needed by the memory module/ chip/subunit, and/or by detecting a predefined power-up sequence of the memory module/chip/subunit as dictating that the internal voltage regulator be enabled/disabled upon power-up, etc.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of various embodiments of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Note further that any methods described in the present disclosure may be implemented through the use of a VHDL (VHSIC Hardware Description Language) program and a VHDL chip. VHDL is an exemplary design-entry language for Field Programmable Gate Arrays (FPGAs), Application Specific Integrated Circuits (ASICs), and other similar electronic devices. Thus, any software-implemented method described herein may be emulated by a hardware-based VHDL program, which is then applied to a VHDL chip, such as a FPGA.

Having thus described embodiments of the invention of the present application in detail and by reference to illustrative embodiments thereof, it will be apparent that modifications and variations are possible without departing from the scope of the invention defined in the appended claims.

What is claimed is:

1. A memory chip comprising:
    an internal voltage regulator;
    a memory chip subunit coupled to the internal voltage regulator; and
    a bypass switch within the internal voltage regulator, wherein the bypass switch selectively enables and disables the internal voltage regulator, wherein the internal voltage regulator is disabled in response to voltage of an external voltage source substantially matching a requisite internal voltage, wherein the requisite internal voltage has a voltage level that is required to operate the memory chip subunit within predefined parameters.

2. The memory chip of claim 1, wherein the internal voltage regulator comprises:
    a voltage switch that selectively couples the external voltage source to a voltage input to the memory chip subunit;
    a comparator that compares a reference voltage with a voltage at the voltage input to the memory chip subunit; and
    the bypass switch selectively coupling the comparator to the voltage switch.

3. The memory chip of claim 1, wherein the internal voltage regulator is coupled directly to the memory chip subunit, wherein the memory chip subunit is a memory core, wherein the memory core contains stored data within a memory module.

4. The memory chip of claim 1, wherein the internal voltage regulator is coupled directly to the memory chip subunit, wherein the memory chip subunit is a memory periphery, wherein the memory periphery is located within a memory module, and wherein the memory periphery provides a state machine, a timing circuit, and a command decoder for use by a memory core.

5. A memory module comprising one or more memory chips, wherein at least one of the memory chips comprises:
    an internal voltage regulator;
    a memory chip subunit coupled to the internal voltage regulator; and
    a bypass switch within the internal voltage regulator, wherein the bypass switch selectively enables and disables the internal voltage regulator, wherein the internal voltage regulator is enabled in response to an external voltage source failing to provide an external voltage that substantially matches a requisite internal voltage, wherein the requisite internal voltage has a voltage level that is required to operate the memory chip subunit within predefined parameters.

6. The memory module of claim 5, wherein the internal voltage regulator comprises:
    a voltage switch that selectively couples the external voltage source to a voltage input to the memory chip subunit;
    a comparator that compares a reference voltage with a voltage at the voltage input to the memory chip subunit; and
    the bypass switch coupling the comparator to the voltage switch.

7. The memory module of claim 5, wherein the memory chip subunit is a memory core, wherein the memory core contains stored data within the memory module.

8. The memory module of claim 5, wherein the memory chip subunit is a memory periphery, wherein the memory periphery is located within the memory module, and wherein the memory periphery provides a state machine, a timing circuit, and a command decoder for use by a memory core.

9. A computer system comprising a memory module, wherein the memory module comprises a memory chip, and wherein the memory chip comprises:

an internal voltage regulator;

a memory chip subunit coupled to the internal voltage regulator; and a bypass switch within the internal voltage regulator, wherein the bypass switch selectively enables and disables the internal voltage regulator, wherein the internal voltage regulator is disabled in response to an external voltage source providing an external voltage that substantially matches a requisite internal voltage, and wherein the requisite internal voltage has a voltage level that is required to operate the memory chip subunit within predefined parameters.

10. The computer system of claim 9, wherein the internal voltage regulator comprises:

a voltage switch that selectively couples the external voltage source to a voltage input to the memory chip subunit;

a comparator that compares a reference voltage with a voltage at the voltage input to the memory chip subunit; and the bypass switch coupling the comparator to the voltage switch.

11. The computer system of claim 9, wherein the memory chip subunit is a memory core, wherein the memory core contains stored data within the memory module.

12. The computer system of claim 9, wherein the memory chip subunit is a memory periphery, wherein the memory periphery is located within the memory module, and wherein the memory periphery provides a state machine, a timing circuit, and a command decoder for use by a memory core.

13. A method of regulating an internal voltage in a memory, the method comprising:

powering up a memory chip with an external voltage source; and in response to the external voltage source providing an external voltage that substantially matches a requisite internal voltage needed by a memory chip subunit within the memory chip to operate within predefined parameters, disabling an internal voltage regulator, wherein disabling the internal voltage regulator causes the external voltage to be supplied directly to the memory chip subunit.

14. The method of claim 13, further comprising:

in response to the external voltage failing to substantially match the requisite internal voltage needed by the memory chip subunit to operate within predefined parameters, enabling an internal voltage regulator to regulate the external voltage before being supplied to the memory chip subunit.

15. The method of claim 13, wherein said disabling of the internal voltage regulator is controlled by an external control signal, wherein the external control signal is generated outside of the internal voltage regulator.

16. The method of claim 13, wherein the internal voltage regulator is disabled in response to a detection of the external voltage source providing the requisite internal voltage needed by the memory module.

17. The method of claim 13, wherein the internal voltage regulator is disabled in response to detecting that a memory module is coupled to a dedicated memory power subsystem within a computer.

18. The method of claim 13, wherein an enabled/disabled status of the internal voltage regulator is controlled by a predefined power-up sequence of the memory chip subunit.

* * * * *